(12) United States Patent
Ohnishi et al.

(10) Patent No.: US 6,693,570 B2
(45) Date of Patent: Feb. 17, 2004

(54) DIGITAL-TO-ANALOG CONVERSION CIRCUITRY INCORPORATING A SIMPLIFIED TESTING CIRCUIT

(75) Inventors: Shinsuke Ohnishi, Tokyo (JP); Daisuke Takagi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/283,097

(22) Filed: Oct. 30, 2002

(65) Prior Publication Data

US 2003/0201921 A1 Oct. 30, 2003

(30) Foreign Application Priority Data

Apr. 30, 2002 (JP) ........................................ 2002-128047

(51) Int. Cl.[7] ................................................ H03M 1/10
(52) U.S. Cl. ........................................ 341/120; 341/144
(58) Field of Search ................................ 341/120, 144, 341/121, 118, 119

(56) References Cited

U.S. PATENT DOCUMENTS 6,566,857 B1 * 5/2003 Kakizawa .................... 341/120

* cited by examiner

*Primary Examiner*—Brian Young
(74) *Attorney, Agent, or Firm*—Rabin & Berdo, P.C.

(57) ABSTRACT

Digital-to-analog (DA) conversion circuitry with a simplified testing circuit includes a DA converter to which test data, initially "0", may be applied. The DA converter feeds an analog voltage corresponding to the test data to a voltage holding circuit. Subsequently the test data is incremented to "1" and then converted to a corresponding analog voltage by the DA converter. A comparator compares the analog voltage corresponding to the test data "1" with the previous analog voltage held in the voltage holding circuit and corresponding to the test data "0". When the test data is sequentially incremented by 1 (one) at intervals, the voltage output from the DA converter is higher than the voltage held in the voltage holding circuit while the DA converter operates normally. The function of the DA converter can be easily, rapidly tested by monitoring the output of the comparator.

10 Claims, 9 Drawing Sheets

DIGITAL-TO-ANALOG CONVERSION CIRCUITRY INCORPORATING A SIMPLIFIED TESTING CIRCUIT

BACKGROUND OF THE INVENTION

1. Field of the Invention

The present invention relates to digital-to-analog (DA) conversion circuitry incorporating therein a simplified testing circuit for testing the function of a DA converter or converters included in the circuitry.

2. Description of the Background Art

Conventionally, there is a type of DA conversion circuitry which is adapted to receive test data in a digital form on its test data port from a tester jig in a test mode designated by the jig and produce an analog voltage corresponding to the test data from its analog output port, which is in turn connected to a voltmeter indicating the analog voltage. More specifically, when a mode signal provided from the tester jig indicates the test mode, a selector included in the conversion circuitry selects the test data port and transfers the test data to a DA converter to be tested which is also included in the circuitry. The DA converter in turn outputs an analog voltage corresponding to the test data. A buffer amplifier connected to the DA converter amplifies the analog voltage and feeds the analog output port with the thus amplified analog voltage.

In this condition, the test data is fed from the jig to the DA converter via the selector. The voltmeter connected to the output port of the circuitry indicates the analog voltage derived from the test data. If one views the voltmeter and determines the analog voltage lying in its allowable range, then he or she increments the test data and measures again the resultant analog voltage on the voltmeter. In this manner, while the test data are sequentially incremented, the resultant analog voltages are compared with the test data for determining whether or not the DA converter satisfies its specifications.

As stated above, in the conventional DA conversion circuitry, analog voltages sequentially output from the circuitry are measured by the voltmeter one by one while being compared with the sequentially incremented test data. However, such a testing procedure is sophisticated and time-consuming.

SUMMARY OF THE INVENTION

It is an object of the present invention to provide DA conversion circuitry incorporating a simplified testing circuit that allows a DA converter or converters included in the circuitry to be easily tested in a shorter time.

In accordance with the present invention, DA conversion circuitry includes a selector for selecting test data input from the outside of the circuitry when a mode signal selectively designating a usual mode or a test mode designates the test mode. A DA converter converts the test data selected by the selector to an analog voltage. A voltage holding circuit holds the analog voltage output from the DA converter in response to a sampling signal input also from the outside and outputs it as a hold voltage. A comparator compares the analog voltage output from the DA converter with the hold voltage and outputs a signal representative of a result of comparison. The comparator may be replaced with a differential amplifier circuit that outputs a voltage substantially equal to a difference between the analog voltage output from the DA converter and the hold voltage.

Also, in accordance with the present invention, DA conversion circuitry includes a first selector configured for selecting first test data input from the outside of the circuitry when a mode signal selectively designating a usual mode or a test mode designates the test mode. A second selector selects second test data also input from the outside when the mode signal designates the test mode. A first DA converter converts the first test data selected by the first selector to a first analog voltage while a second DA converter converts the second test data selected by the second selector to a second analog voltage. A differential amplifier circuit outputs a voltage substantially equal to a difference between the first and second analog voltages output from the first and second DA converters, respectively.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
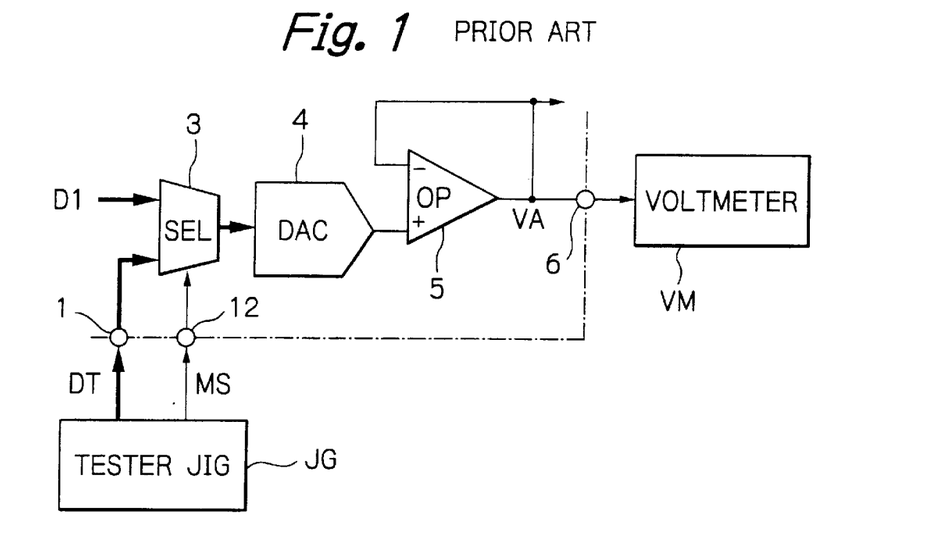
FIG. 1 is a schematic block diagram showing conventional DA conversion circuitry together with an arrangement for testing it.

To better understand the present invention, a brief reference will be made to FIG. 1 showing conventional DA conversion circuitry with a circuit for testing a DA converter included in the circuitry. The DA conversion circuitry illustrated is built in an LSI (Large-Scale Integration) circuit or similar IC (Integrated Circuit). As shown, the DA conversion circuitry includes one input port 1 to which test data DT is input and another input port 2 to which a mode signal MS is applied. In the figures, connections on which digital data are conveyed are depicted with thicker solid lines. The input ports 1 and 2 are connected to a selector (SEL) 3. The selector 3 selects either one of input data DI to be dealt with in a usual operation mode and test data DT in response to the mode signal MS. The selector 3 has its output connected to a DA converter (DAC) 4.

The DA converter 4 converts digital data output from the selector 3 to an analog voltage. The DA converter 4 has its output connected to an operational amplifier (OP) 5 playing the role of a buffer amplifier. The buffer amplifier 5 amplifies the analog voltage output from the DA converter 4 and feeds the amplified analog voltage, labeled VA, to the outside of the circuitry from its output port 6 as well as to another utility circuit included in the integrated circuit.

To test the DA converter 4, a tester jig JG is connected to the input ports 1 and 2 while a voltmeter VM is connected to the output port 6. In this condition, the mode signal MS designating a test mode is input from the jig JG to the selector 3 on the input port 2 for causing the selector 3 to select the input port 1. Subsequently, the test data DT, which may be "0 (zero)" by way of example, is fed from the jig JG to the input port 1. The voltmeter VM connected to the output port 6 indicates an analog voltage VA derived from the test data DT. If the analog voltage VA lies in an allowable range, then the test data "0" is incremented to "1 (one)" while the resultant analog voltage VA appearing on the output port 6 is again measured by the voltmeter VM. The test data DT is sequentially incremented thereafter. Every time the test data DT is incremented, the voltmeter VM measures the analog voltage VA appearing on the output port 6. The analog voltage VA is compared with the test data DT for determining whether or not the DA converter 4 satisfies the intended specifications. The conventional DA convention circuitry has the previously described problem left unsolved.

Figure 2:
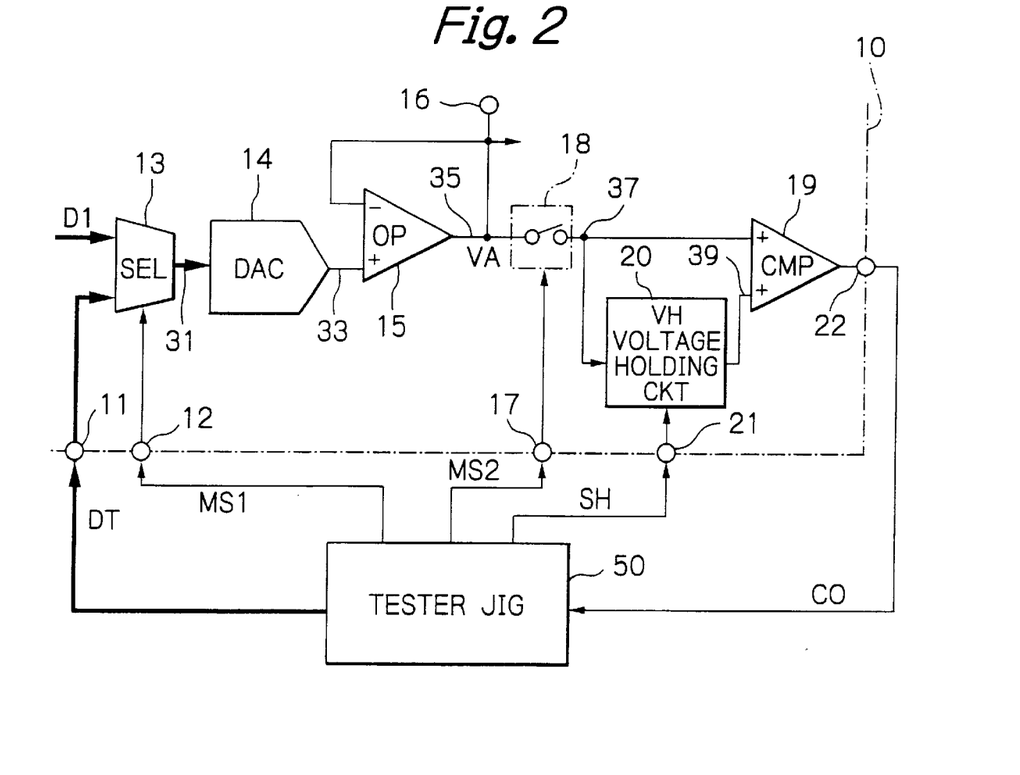
FIG. 2 is a schematic block diagram showing DA conversion circuitry embodying the present invention together with an arrangement for testing it.

Referring to FIG. 2, DA conversion circuitry embodying the present invention is also built in an LSI or similar integrated circuit, which is symbolically indicated by a dot-and-dash line 10. As shown, the DA conversion circuitry includes one input port 11 to which test data DT is input in a digital form and a control terminal 12 to which a mode signal MS1 is input from a tester jig 50. The input port 11 and control terminal 12 are connected to a selector 13. The selector 13 has another input port for receiving digital data DI to be dealt with in a usual operation or DA conversion mode. The selector 13 is adapted to selectively connect either one of the input data DI and test data DT to its output port 31 in response to the mode signal MS1. With the embodiment, the selector 13 is adapted to select the input port DI when the control input 12 is idle or receives the mode signal representative of the usual operation mode from the tester jig 50, or otherwise the other input port 11. The output 31 of the selector 13 is connected to a DA converter 14, which is to be tested in operation. In the specification, signals are designated with reference numerals designating connections on which the signals appear.

The DA converter 14 is adapted to convert the digital data 31 to an analog voltage corresponding thereto to develop the resultant analog voltage on its output 33. Specifically with the illustrative embodiment, the DA converter 14 is adapted to produce the analog voltage VA having a value i [volts] when the input digital data DI or DT has a value i, which is an integer. The output 33 is connected to a non-inverting port (+) of an operational or operational amplifier (OP) 15.

The operational amplifier 15 has its output 35 connected in a voltage-follower configuration as illustrated and plays the role of a buffer amplifier. An analog voltage VA output from the buffer amplifier 15 is delivered to another utility circuit, not shown, included in the integrated circuit 10 and also to the outside of the DA conversion circuitry via a port 16. The port 16 may be used to test the electric characteristics of the DA converter 14. Further, the output 35 of the buffer amplifier 15 is connected to a switch 18. Also connected to the switch 18 is a control terminal 17 to which another mode signal MS2, which designates either one of a usual mode and a test mode, is applied from the tester jig 50, so that the switch 18 is selectively turned on and off in respons to the mode signal MS2. The switch 18 has its output 37 connected to the non-inverting input (+) of a comparator (CMP) 19 and the input of a voltage holding circuit 20.

The voltage holding circuit 20 has a port 21 for receiving a sampling signal SH input from the tester jig 50. The voltage holding circuit 20 is adapted to hold a voltage fed from the buffer amplifier 15 via the switch 18 and outputs it as a hold voltage VH. The voltage holding circuit 20 has its output 39 connected to the inverting input (−) of the comparator 19. The comparator 19 is adapted to compare the voltages input to its two input ports 37 and 39 with each other and output a signal CO representative of the result of comparison on its output port 22. More specifically, the signal CO goes high (H) if the voltage on the non-inverting input (+) of the comparator 19 is higher than the voltage on the inverting input (−) of the comparator 19 or otherwise goes low (L). The output 22 of the comparator 19 functions as a circuitry output port.

In operation, when the control input 12 is idle or receives the mode signal representative of the usual operation mode from the tester jig 50, the selector 13 selects the input port DI to connect the latter to its output 31. The digital data DI received on the input port DI is then transferred to the output port 31 and then to the DA converter 14. The DA converter 14 converts the input data 31 to an analog voltage corresponding thereto and develops it on its output port 33. The thus converted analog voltage 33 is produced on the output port 16 through the buffer amplifier 15 and ultimately to the utility circuitry, not shown, in the integrated circuit 10.

Figure 3:
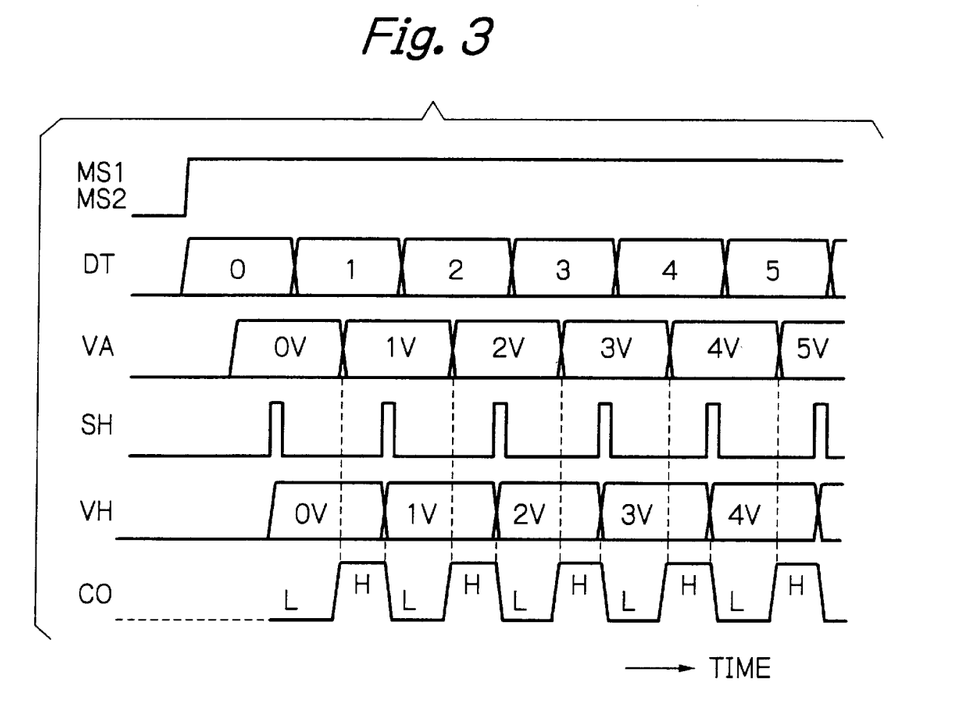
FIG. 3 plots signal waveforms useful for understanding a specific testing procedure to be executed with the circuitry of FIG. 2 in a test mode.

A specific testing procedure unique to the illustrative embodiment will be described with reference to FIG. 3 also. Prior to a test, the tester jig 50 is connected to the ports 11, 12, 17, 21 and 22 of the DA conversion circuitry 10, as shown in FIG. 2. First, the mode signal MS1 designating the test mode is fed from the jig 50 to the selector 13 on the input port 12, causing the selector 13 to select the input port 11. At the same time, the other mode signal MS2 is fed from the jig 50 to the switch 18 on its control terminal 17 to thereby turn on the switch 18. Subsequently, the test data DT whose value is now "0" is delivered from the jig 50 to the selector 13 on the input port 11, and then to the DA converter 14.

On the elapse of a preselected period of time necessary for conversion, the DA converter 14 outputs the analog voltage VA, which is now 0 volt (V). The analog voltage VA is delivered to the comparator 19 via the switch 18 while closing now. Presently, the voltage holding circuit 20 holds the voltage VH which is indefinite at this stage of operation. The comparator 19 compares the analog voltage VA with the indefinite hold voltage VH, so that the output signal CO of the comparator 19 representative of the result of comparison is neglected.

As soon as the period of time elapses necessary for the DA converter 14 to operate and the comparator 19 to become stable and for determining the output signal CO of the comparator 19, the sampling signal SH is fed from the jig 50 to the voltage holding circuit 20 on the port 21. In response, the voltage holding circuit 20 holds the analog voltage VA, which is now 0 volt, and feeds it to the comparator 19 as a hold voltage VH. The two voltages 37 and 39 input to the comparator 19 are therefore equal to each other, so that the output signal CO of the comparator 19 goes low. Thereafter, the output 39 of the sampling signal SH is interrupted, but the hold voltage VH of 0 volt is continuously held in the voltage holding circuit 20.

Subsequently, the test data DT output from the jig 50 is incremented by 1 (one) to "1". As a result, the analog voltage VA output from the DA converter 14 rises to 1 volt on the elapse of the conversion time of the DA converter 14 and is input to the comparator 19 and voltage holding circuit 20. However, the hold voltage VH output from the voltage holding circuit 20 remains at 0 volt because the sampling signal SH is now not input to the circuit 20. Consequently, the output signal CO of the comparator 19 representative of the result of comparison goes high, showing that the analog voltage VA output from the DA converter 14 has risen.

After the signal CO has gone high, the sampling signal SH is again fed from the tester jig 50 to the voltage holding circuit 20, causing the circuit 20 to hold 1 volt as a hold voltage VA. As a result, the signal CO output from the comparator 19 again goes low.

Subsequently, the jig 50 consecutively outputs the test data DT which sequentially increment at the preselected intervals and the sampling signals SH associated in timing with the incrementing test data DT, as stated above. The voltage holding circuit 20 holds an analog voltage VA corresponding to test data DT having appeared immediately before the current test data DT. It follows that the output signal CO of the comparator 19 is representative of the result of comparison between the hold voltage VH and the analog voltage VA corresponding to the current test data DT. The resultant signal CO is monitored via the jig 50 at a timing when the analog voltage VA output from the DA converter 14 is stable. If the signal CO is constantly in its high level, it is then determined that the DA converter 14 is correctly producing the sequentially increasing analog voltage VA.

As stated above, with the illustrative embodiment, by using the test data DT input from the outside, i.e. the tester jig 50, and the sampling signal SH related in timing to the test data DT, it can easily, rapidly be determined whether or not analog voltages VA each corresponding to particular test data DT are sequentially generated.

Figure 4:
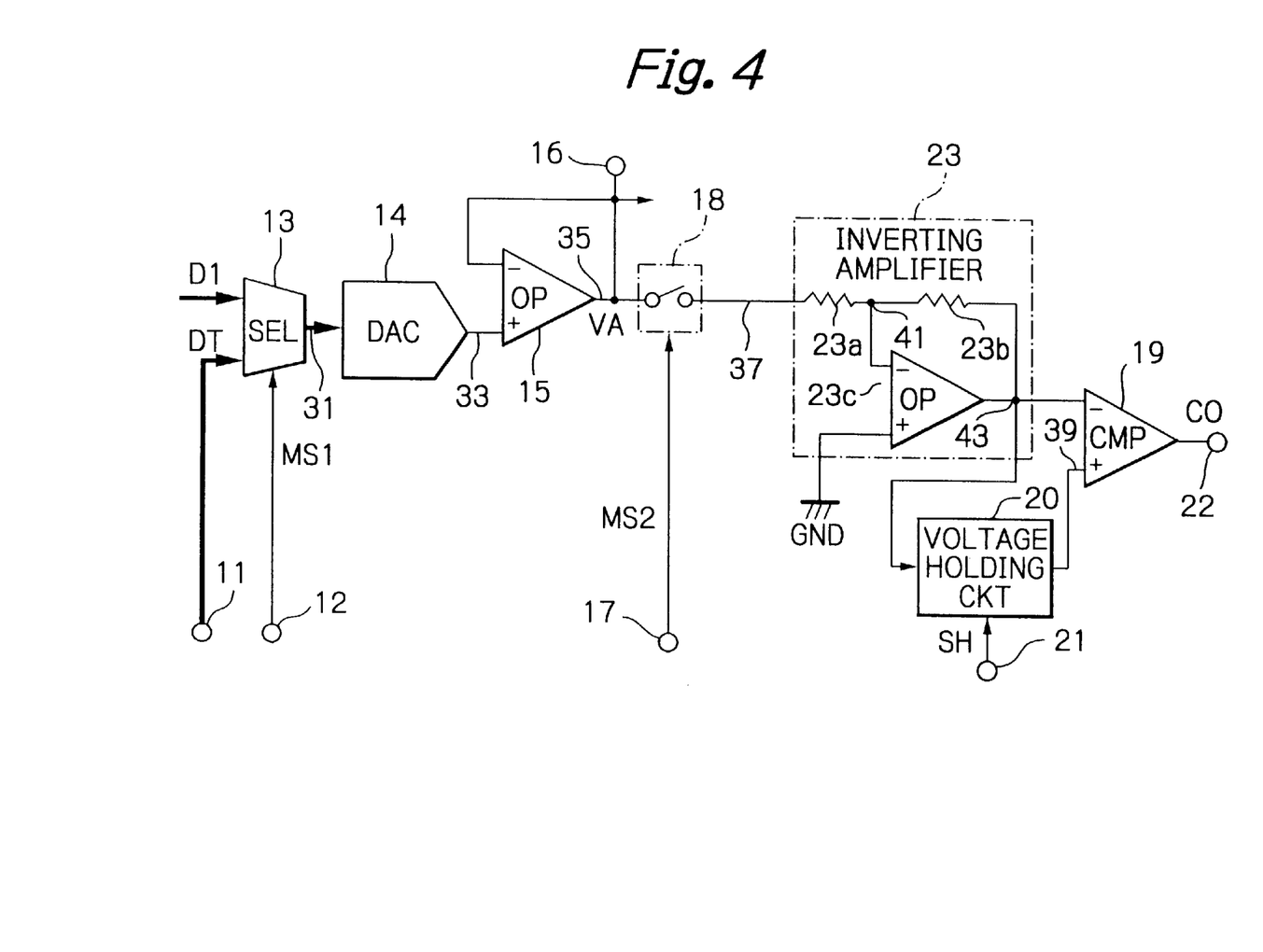
FIG. 4 is a schematic block diagram showing an alternative embodiment of the present invention.

Reference will now be made to FIG. 4 for describing an alternative embodiment of the present invention. As shown, the alternative embodiment is generally the same as the embodiment shown in FIG. 2 except that it further includes an inverting amplifier circuit 23 which is connected as illustrated to the output 37 of the switch 18. In the figures, structural elements like those shown in FIG. 1 are designated by identical reference numerals and will not be described specifically in order to avoid redundancy.

The inverting amplifier circuit 23 is made up of resistors 23a and 23b and an operational amplifier 23c which are connected as illustrated. The resistor 23a is connected to the output 37 of the switch 18 at its one end and to the inverting input (−) of the operational amplifier 23c at its other end 41. The operational amplifier 23c has its non-inverting input (+) connected to ground GND. The resistor 23b is connected between the output 43 and the inverting input 41 of the operational amplifier 23c. With this configuration, the inverting amplifier circuit 23 multiplies the analog voltage VA output from the buffer amplifier 15 through the switch 18, when closed, by a gain equal to a value, −(Rb/Ra), where Ra and Rb denote the resistances of the resistors 23a and 23b, respectively. The multiplied voltage appears on the output 43 of the inverting amplifier circuit 23.

As for the rest of the configuration, the illustrative embodiment is identical with the previous embodiment. It is to be noted that in the illustrative embodiment the comparator 19 is connected so as to compare the analog voltage VA amplified by the inverting amplifier circuit 23 and appearing on the output 43 with the hold voltage 39 held in the voltage holding circuit 20.

The inverting amplifier circuit 23 is adapted to amplify the analog voltage VA, as stated above. Therefore, even with an application where the DA converter 14 has the smaller difference between the steps of the output analog voltage VA, the illustrative embodiment can surely determine whether or not the analog voltage VA is increasing in unison with the test data DT incrementing.

Figure 5:
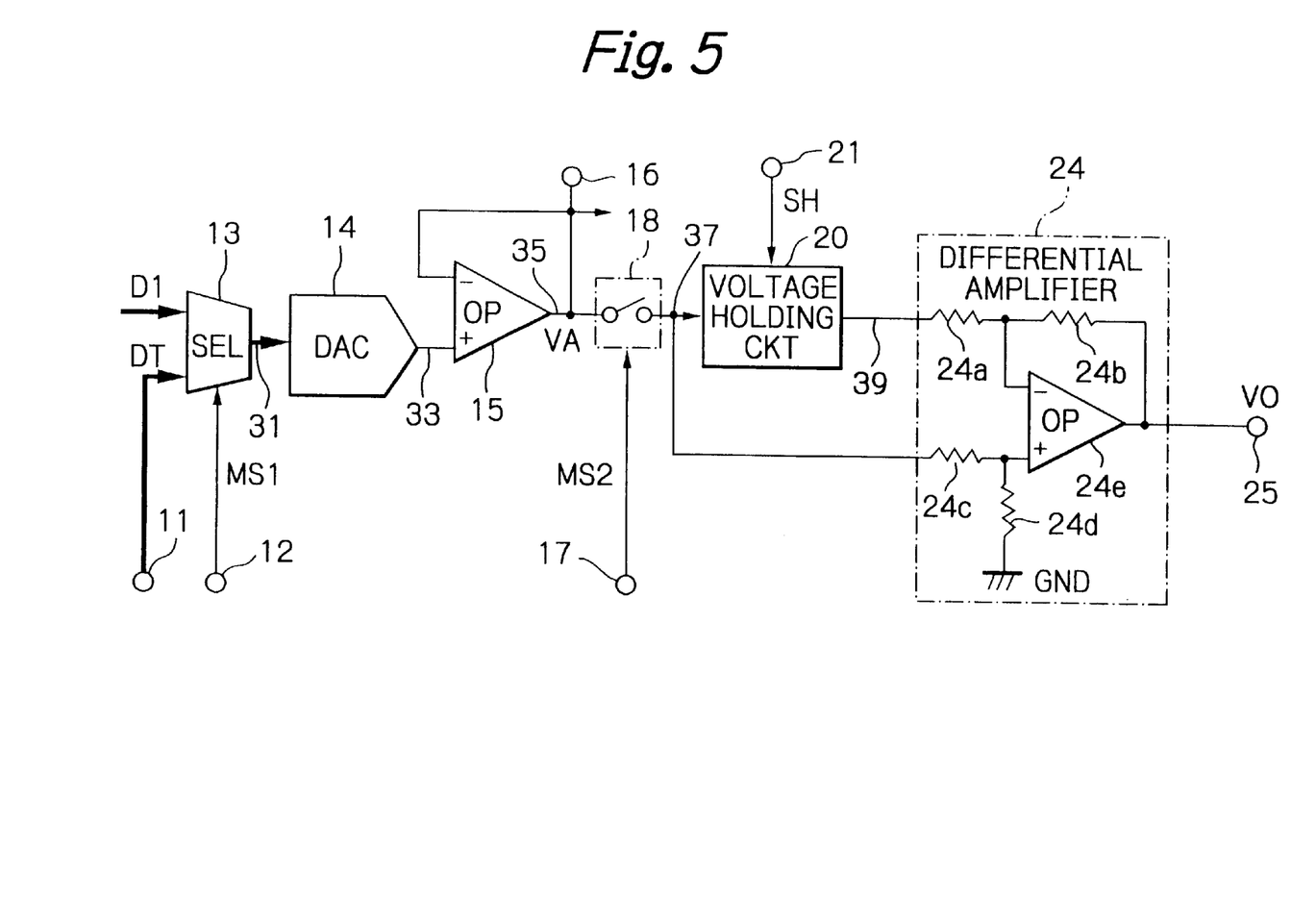
FIG. 5 is a schematic block diagram, similar to FIG. 4, showing another alternative embodiment of the present invention.

Another alternative embodiment of the present invention will be described with reference to FIG. 5. In FIG. 5 also, structural elements like those shown in FIG. 1 are designated by identical reference numerals and will not be described specifically in order to avoid redundancy. As shown, this alternative embodiment is generally the same as the embodiment shown in FIG. 2 except that a differential amplifier circuit 24 is substituted for the comparator 19 shown in FIG. 1.

The differential amplifier circuit 24 is made up of resistors 24a, 24b, 24c and 24d and an operational amplifier 24e connected as illustrated. The output 39 of the voltage holding circuit 20 is connected to the inverting input (−) of the operational amplifier 24e via the resistor 24a. The resistor 24b is connected between the inverting input (−) and an output 25 of the operational amplifier 24e. The output 37 of the switch 18 is connected to the non-inverting input (+) of the operational amplifier 24e via the resistor 24c. The non-inverting input (+) of the operational amplifier 24e is also connected to ground GND. The output 25 of the operational amplifier 24e functions as the circuitry output port, on which appears an output voltage VO. As for the remainder of the configuration, the illustrative embodiment is identical with the embodiment shown in FIG. 1.

With the embodiment, the resistors 24a through 24d included in the differential amplifier circuit 24 may all have the same resistance as each other. In that case, the amplification factor of the differential amplifier circuit 24 is unity, so that the circuit 24 produces an output voltage VO substantially equal to a difference of the analog voltage VA from the hold voltage VH on the output port 25. The amplification factor of unity is only illustrative. For example, in an application where the step value or voltage value assigned to the DA converter 14 is small, the amplification factor may be larger than unity to further promote accurate testing.

Figure 6:
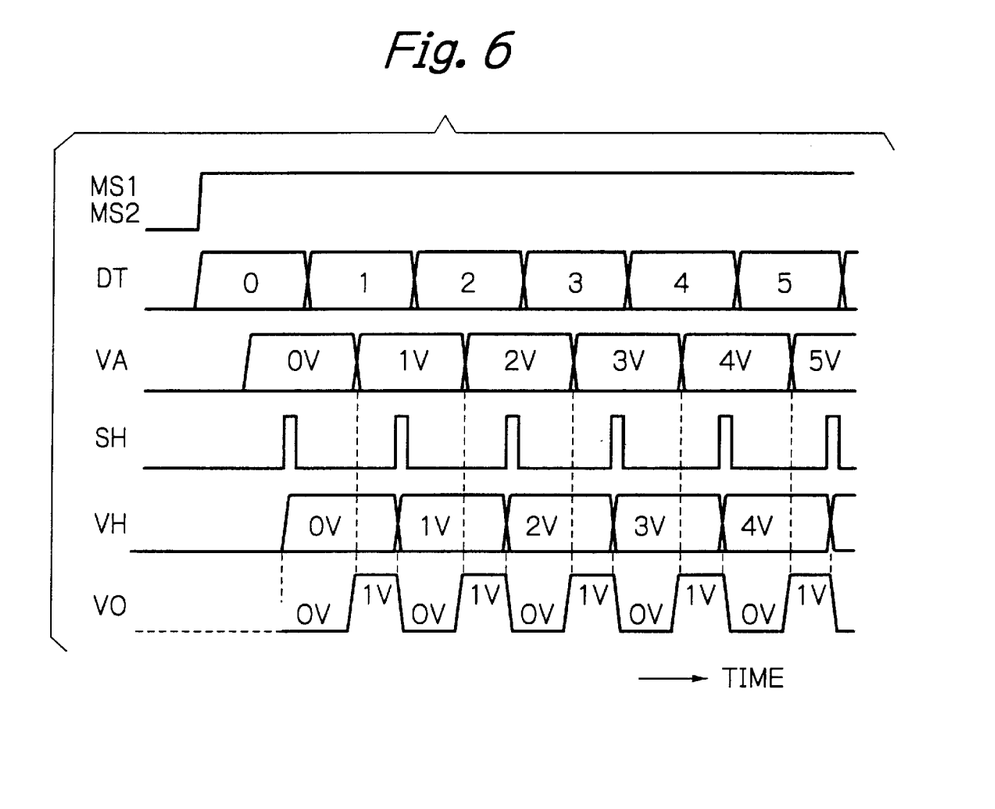
FIG. 6 plots signal waveforms, similar to FIG. 3, useful for understanding a specific testing procedure to be executed with the circuitry of FIG. 5 in a test mode.

FIG. 6 demonstrates a specific testing procedure particular to the illustrative embodiment. As shown, the DA converter 14 and voltage holding circuit 20 operate in exactly the same manner as in the embodiment of FIG. 1. The differential amplifier circuit 24 produces the output voltage VO which is equal to a difference between the analog voltage VA corresponding to the current test data DT and the analog hold voltage VH held in the voltage holding circuit 20 and having appeared immediately before the current data DT. The signal VO is monitored at a timing when the analog voltage VA output from the DA converter 14 is stable. If the signal VO is constantly 1 volt or between 0.9 volt and 1.1 volts inclusive of tolerable errors, it is then determined that the analog voltage VA is sequentially increasing with an increase in the test data DT.

With the voltage holding circuit 20 and differential amplifier 24 described above, the illustrative embodiment achieves the same advantage as the embodiment shown in FIG. 1.

Figure 7:
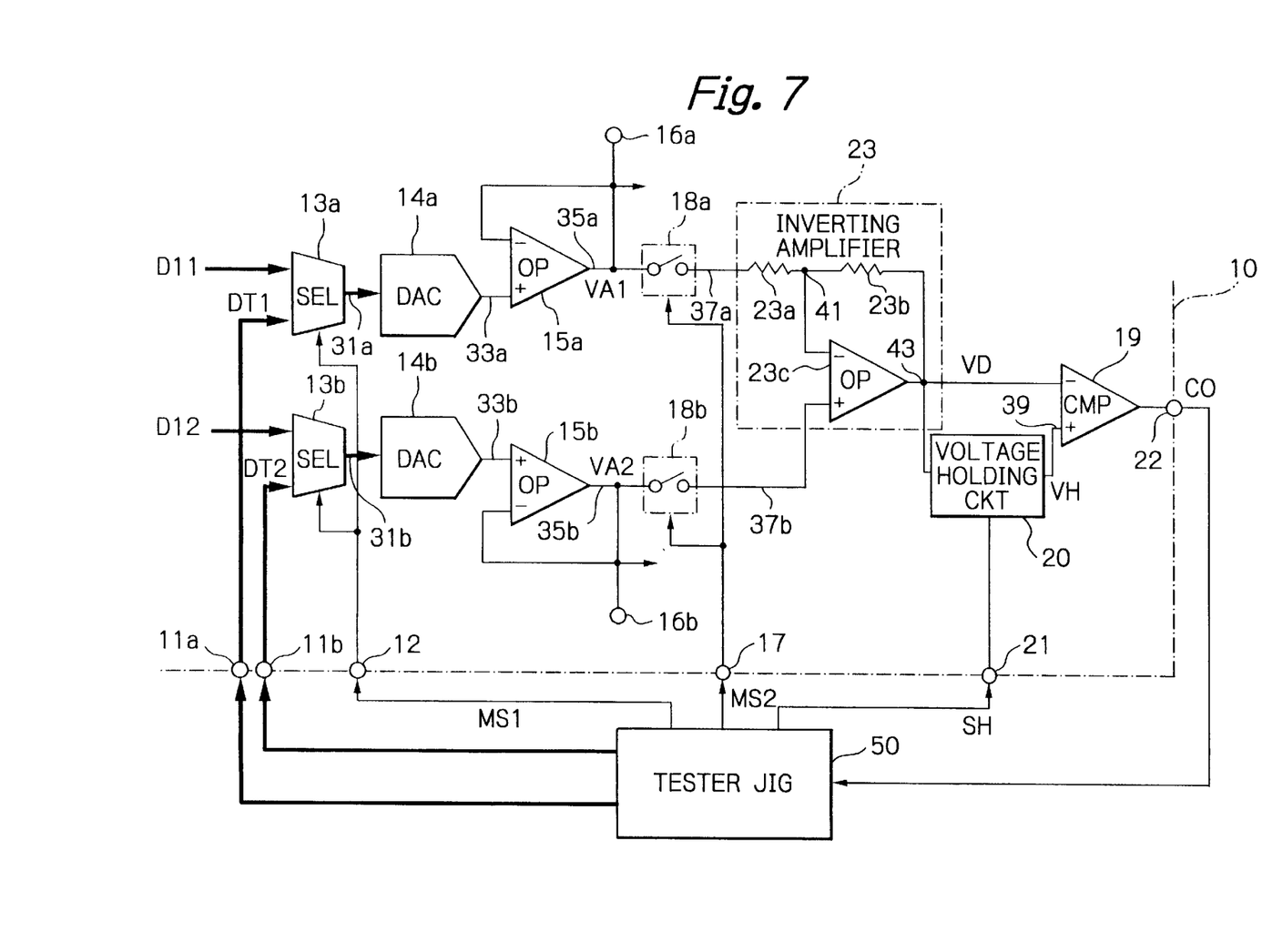
FIG. 7 is a schematic block diagram, similar to FIG. 2, showing still another alternative embodiment of the present invention.

Well, referring to FIG. 7, still another alternative embodiment of the present invention also built in an LSI or a similar integrated circuit will be described. In FIG. 7, structural elements like those shown in FIG. 4 are designated by identical reference numerals and will not be described specifically in order to avoid redundancy. As shown, this further alternative embodiment is generally the same as the embodiment shown in FIG. 4 except that the instant embodiment includes a couple of DA conversion lines or systems, designated with the reference numerals followed by letters a and b, with the a testing circuit shared by the couple of DA conversion systems.

One of the DA conversion lines includes a selector 13a configured to selectively convey input data DI1 dealt with in a usual operation mode or test data DT1 applied to its input port 11a to its output port 31a in response to the mode signal MS1. The output 31a of the selector 13a is connected to a DA converter 14a whose output 33a is, in turn, connected to a buffer amplifier (OP) 15a. The buffer amplifier 15a outputs an analog voltage VA1 to be delivered to a utility circuit, not shown, in the integrated circuit, from its output port 16a, and to the input of a switch 18a.

Likewise, the other of the DA conversion lines includes another selector 13b configured to selectively transfer input data DI2 dealt with in the usual operation mode or test data DT2 applied to its input port 11b in response to the mode signal MS1 to its output port 31b. The output 31b of the selector 13b is connected to another DA converter 14b whose output 35b is, in turn, connected to another buffer amplifier (OP) 15b. An analog voltage VA2 output from the buffer amplifier 15b is delivered to a utility circuit, also not shown, in the integrated circuit, from a port 16b, and also to the input of another switch 18b.

In the specific illustrative embodiment, the DA converters 14a and 14b are adapted to produce the output voltages VA1 and VA2, respectively, which take a value i volt when the input data has a value i.

The switches 18a and 18b each are selectively turned on or off in response to the mode signal MS2 applied to the port 17. The switches 18a and 18b have outputs 37a and 37b, respectively, connected to the inverting amplifier circuit 23 as illustrated. The inverting amplifier circuit 23 is made up of the resistors 23a and 23b and operational amplifier 23c. The resistor 23a is connected to an output 37a of the switch 18a at one end and to the inverting input (−) of the operational amplifier 23c at the other end 41. The non-inverting input (+) of the operational amplifier 23c is connected to an output 37b of the other switch 18b. The resistor 23b is connected between the output 43 and the inverting input (−) of the operational amplifier 23c. The resistors 23a and 23b have the same resistance as each other, so that the operational amplifier 23c outputs a voltage VD that is substantially equal to a difference between the-analog voltages VA2 and VA1.

The output 43 of the inverting amplifier circuit 23 is connected to the inverting input (−) of the comparator 19 and also to the input of the voltage holding circuit 20. The voltage holding circuit 20 holds a voltage applied to its input in response to the sampling signal SH input on the port 21 and outputs the held voltage as a hold voltage VH. The output 39 of the voltage holding circuit 20 is connected to the non-inverting input (+) of the comparator 19. Again, the comparator 19 compares the voltages input to its two input ports 43 and 39 and outputs a signal CO representative of the result of comparison. More specifically, the signal CO goes high if the voltage VH on the non-inverting input (+) is higher than the voltage VD on the inverting input (−) or goes low otherwise. The output CO of the comparator 19 is connected to the output port 22.

Figure 8:
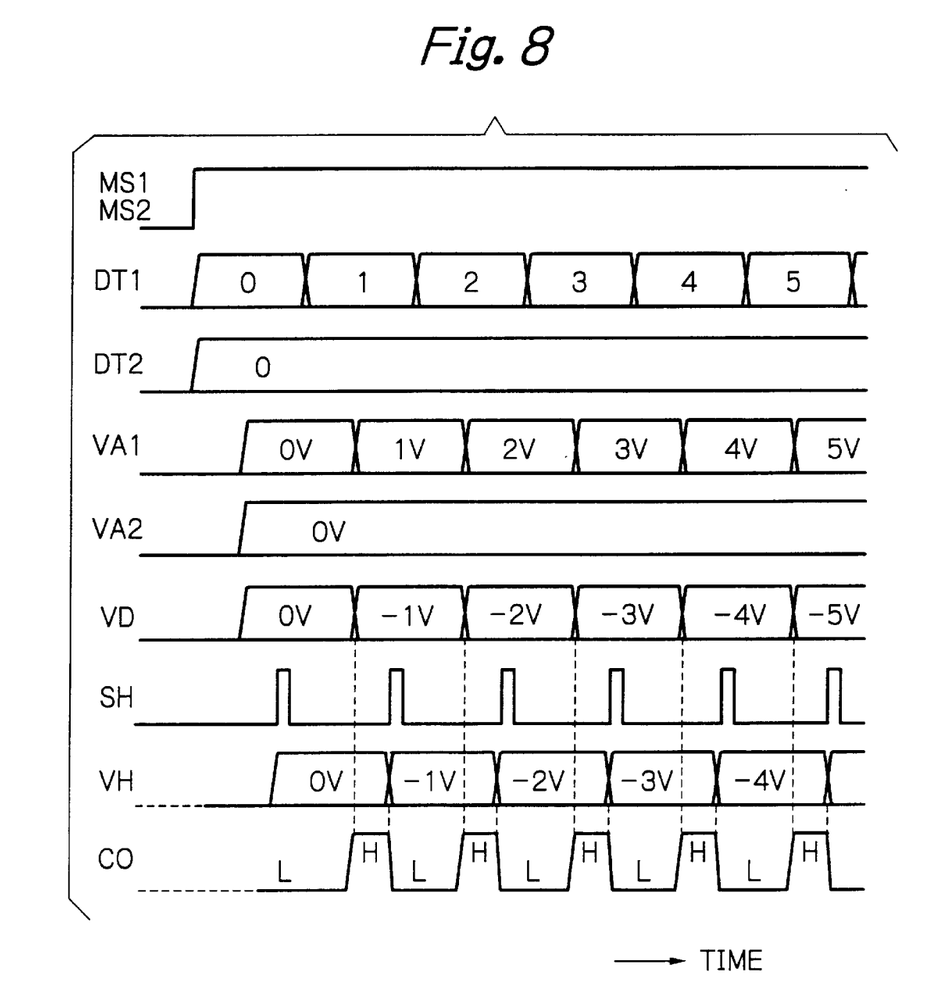
FIG. 8 plots signal waveforms, similar to FIG. 3, useful for understanding a specific testing procedure to be executed with the circuitry of FIG. 7.

FIG. 8 demonstrates a specific testing procedure particular to the illustrative embodiment. First, the mode signal MS1 is fed from the jig 50 to the selectors 13a and 13b in order to cause them to select the input ports 11a and 11b for receiving the test data DT1 and DT2, respectively. At the same time, the other mode signal MS2 is fed from the jig 50 to the switches 18a and 18b for thereby turning on the switches 18a and 18b. Subsequently, the test data DT1 and DT2 both of which are "0" are delivered from the jig 50 to the selectors 13a and 13b, respectively. The selectors 13a and 13b in turn transfer the test data DT1 and DT2 to the DA converters 14a and 14b, respectively.

On the elapse of a preselected conversion time, the DA converters 14a and 14b respectively output the analog voltages VA1 and VA2 of 0 volt. The analog voltages VA1 and VA2 are input to the inverting amplifier circuit 23 via the switches 18a and 18b, respectively. In response, the inverting amplifier circuit 23 produces a voltage VD representative of a difference between the analog voltages VA1 and VA2, which is 0 volt in this case. The voltage VD is input to the comparator 19 and voltage holding circuit 20.

The comparator 19 compares the voltage VD with a hold voltage VH held in the voltage holding circuit 20. Because the hold voltage VH is indefinite at this stage of operation, a signal CO output from the comparator 19 and representative of the result of comparison is neglected.

As soon as a period of time elapses necessary for the DA converters 14a and 14b to operate and the inverting amplifier circuit 23 and the comparator 19 to become stable, and for determining the output signal CO of the comparator 19, the sampling signal SH is fed from the jig 50 to the voltage holding circuit 20 on the port 21. In response, the voltage holding circuit 20 holds the analog voltage VA, which is 0 volt, and feeds the comparator 19 with the voltage VA as a hold voltage VH. The two voltages input to the comparator 19 are now equal to each other, so that the output signal CO of the comparator 19 goes low. Thereafter, the output of the sampling signal SH is interrupted, but the hold voltage VH of 0 volt is continuously held in the voltage holding circuit 20.

Subsequently, the test data DT1 is increased by 1 to "1", but the test data DT2 is fixed at "0". As a result, on the elapse of the conversion time of the DA converter 14a, the analog voltage VA1 output from the DA converter 14a rises to 1 volt. This analog voltage VA1 is routed through the buffer amplifier 15a and switch 18a to the inverting amplifier circuit 23. The inverting amplifier circuit 23 therefore outputs a voltage VD of −1 volt. The sampling signal SH is not fed to the voltage holding circuit 20 at this stage of operation, so that the hold voltage VH output from the voltage holding circuit 20 remains at 0 volt. Consequently, the output signal CO of the comparator 19 goes high, showing that the analog signal VA1 output from the DA converter 14a has risen.

After the signal CO has gone high, the sampling signal SH is again fed to the voltage holding circuit 20. As a result, 0-volt voltage held in the voltage holding-circuit 20 as a hold voltage VH is replaced with −1 volt, causing the signal CO output from the comparator 19 to again go low.

The jig 50 outputs the test data DT1 sequentially incrementing by 1 at preselected intervals and the sampling signal SH related in timing to the test data DT, as stated above. The voltage holding circuit 20 holds an analog voltage VD corresponding to the test data DT1 having appeared immediately before the current test data DT1 as a hold voltage VH. It follows that the output signal CO of the comparator 19 is representative of the result of comparison between the hold voltage VH and the analog voltage VD1 corresponding to the current test data DT1. The signal CO is monitored via the jig 50 at a timing when the analog voltage VA output from the DA converter 14a is stable. If the signal CO is constantly in its high level, then it is determined that the DA converter 14a is correctly outputting the sequentially incrementing analog voltage VA1.

Likewise, the function of the other DA converter 14b can be tested merely if the above-described procedure is repeated by sequentially increasing the test data DT2 while fixing the test data DT1 at "0".

As stated above, by using the test data DT1 and DT2 input from the outside at a preselected timing and the sampling signal SH related in timing to the test data DT1 and DT2, the illustrative embodiment can easily, rapidly determine whether or not the analog voltages VA1 and VA2 corresponding to the test data DT1 and DT2, respectively, are sequentially generated.

Figure 9:
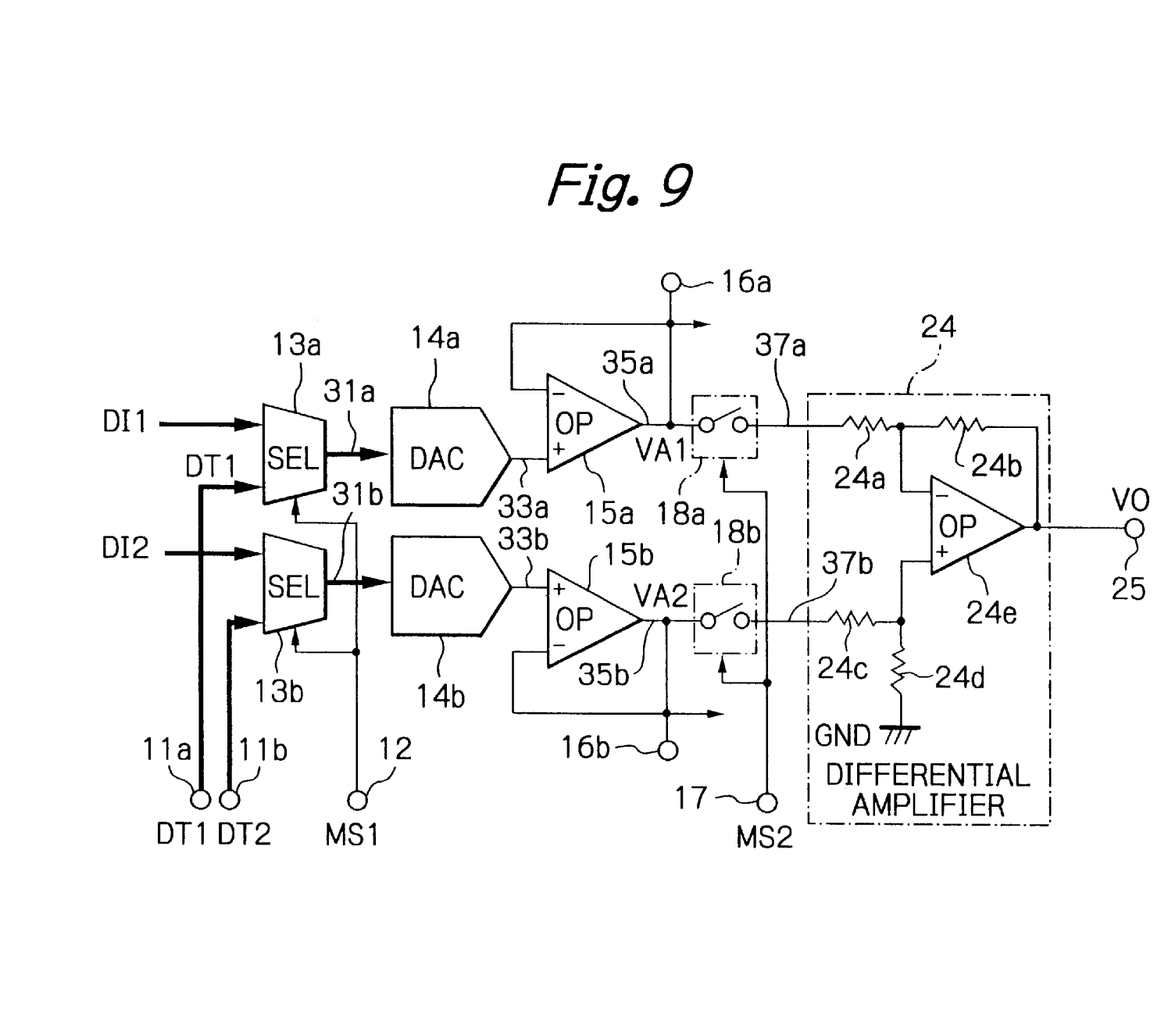
FIG. 9 is a schematic block diagram, similar to FIG. 4, showing a further alternative embodiment of the present invention.

Well, reference will be made to FIG. 9 for describing a further alternative embodiment of the present invention. In FIG. 9, structural elements like those shown in FIG. 7 are designated by identical reference numerals and will not be described specifically in order to avoid redundancy. As seen from the figure, this embodiment is generally the same as the embodiment shown in FIG. 7 except that a differential amplifier circuit 24 is substituted for the inverting amplifier circuit 23, comparator 19 and voltage holding circuit 20 shown in FIG. 7.

The differential amplifier circuit 24 is made up of resistors 24a through 24d and an operational amplifier 24e connected as illustrated. The output 37a of the switch 18a is connected to the inverting input (−) of the operational amplifier 24e via the resistor 24a. The resistor 24b is connected between the inverting input (−) and the output 25 of the operational amplifier 24e. The output 37b of the other switch 18b is connected to the non-inverting input (+) of the operational amplifier 24e via the resistor 24c. The non-inverting input (+) of the operational amplifier 24e is also connected to ground GND via the resistor 24d. The output 25 of the operational amplifier 24e functions as a circuitry output port, on which the output voltage VO appears. As for the rest of the configuration, the illustrative embodiment is identical with the embodiment of FIG. 7.

In the specific embodiment, the resistors 24a through 24d included in the differential amplifier circuit 24 all have the same resistance as each other. It follows that the differential amplifier circuit 24 has an amplification factor of unity and hence produces a voltage substantially equal to a difference between the analog voltages VA2 and VA1 on the output port 25 as an output voltage VO. The amplification factor of unity is merely illustrative. For example, in an application in which the step value or voltage value assigned to the DA converters 14a and 14b is small, the amplification factor may be larger than unity to further promote accurate testing.

Figure 10:
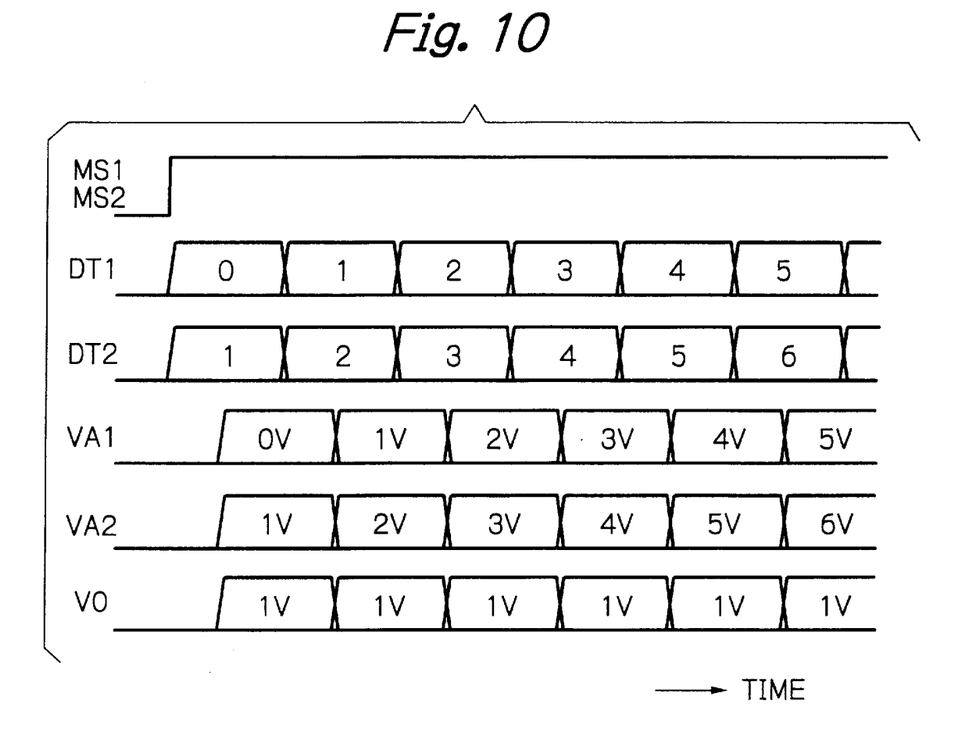
FIG. 10 plots signal waveforms, similar to FIG. 2, useful for understanding a specific testing procedure to be executed with the circuitry of FIG. 9.

FIG. 10 shows a specific testing procedure particular to the illustrative embodiment. First, the mode signal MS1 is fed to the selectors 15a and 15b in order to cause them to select the input ports 11a and 11b, respectively. At the same time, the mode signal MS2 is fed to the switches 18a and 18b for thereby turning on the switches 18a and 18b. Subsequently, test data DT1 and DT2 having values of "0" and "1", respectively, are delivered to the DA converters 14a and 14b via the input ports 11a and 11b and selectors 13a and 13b, respectively.

On the elapse of the conversion time, the DA converters 14a and 14b respectively output an analog voltage VA1 of 0 volt and an analog voltage VA2 of 1 volt. The analog voltages VA1 and VA2 are input to the differential amplifier circuit 24 via the switches 18a and 18b, respectively. In response, the differential amplifier 24 produces the output voltage VO equal to the difference between the analog voltages VA2 and VA1. At this stage of operation, the output voltage VO is 1 volt.

Subsequently, upon the elapse of a preselected period of time, the test data DT1 and DT2 are increased by 1 to "1" and "2", respectively. As a result, the analog voltages VA1 and VA2 input to the differential amplifier circuit 24 increase to 1 volt and 2 volts, respectively. However, the output voltage VO of the differential amplifier circuit 24 remains at 1 volt because the difference between the above-stated analog voltages VA1 and VA2 is 1 volt. Thereafter, the test data DT1 and DT2 both are increased by 1 at a preselected period, but the output voltage VO of the differential amplifier 24 remains at 1 volt. It is therefore possible to confirm the operations of the DA converters 14a and 14b by determining whether or not the output voltage VO is 1 volt at all times, or alternatively between 0.9 volt and 1.1 volt inclusive of tolerable errors.

As stated above, while sequentially incrementing the test data DT1 and DT2 which are different from each other by 1 at all times, the illustrative embodiment monitors the resulting output voltage VO and can therefore easily, rapidly test the functions of the DA converter 14a and 14b.

While the embodiments shown and described are each adapted to receive the sequentially incrementing test data DT or DT1 and DT2 from the minimum value thereof, i.e., "0", they may, of course, be adapted to receive test data sequentially decrementing from the maximum value thereof. The test data may be of sequentially changing in one direction.

In summary, it will be seen that the present invention provides DA conversion circuitry with a simplified testing function that allows a DA converter or converters included in the circuitry to be easily, rapidly tested.

The entire disclosure of Japanese patent application No. 2002-128047 filed on Apr. 30, 2002, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What we claim is:

1. Digital-to-analog (DA) conversion circuitry comprising:
   a DA converter for converting digital data to an analog voltage substantially corresponding to the digital data;
   a first input port for receiving input data to be converted in a digital form;
   a second input port for receiving test data in a digital form;

a selector operative in response to a mode signal for selectively connecting either one of said first and second input ports to said DA converter, said selector connecting said second input port to said DA converter when the mode signal designates a test mode;

a voltage holding circuit interconnected to said DA converter for holding the analog voltage in response to a sampling signal to output the analog voltage held as a hold voltage; and a comparing circuit interconnected to said DA converter and said voltage holding circuit for producing a resultant signal associated with a difference between the analog voltage output from said DA converter and the hold voltage.

2. The DA conversion circuitry in accordance with claim 1, wherein said comparing circuit comprises a comparator interconnected to said DA converter and said voltage holding circuit for comparing the analog voltage output from said DA converter with the hold voltage to output a signal representative of a result of comparison as the resultant signal.

3. The DA conversion circuitry in accordance with claim 2, wherein said comparing circuit further comprises an inverting amplifier interconnected to said DA converter and said voltage holding circuit and said comparator for amplifying the analog voltage output from said DA converter to be fed to said voltage holding circuit and comparator.

4. The DA conversion circuitry in accordance with claim 1, wherein said comparing circuit comprises a differential amplifier circuit interconnected to said DA converter and said voltage holding circuit for outputting as the resultant signal a voltage substantially equal to a difference between the analog voltage output from said DA converter and the hold voltage.

5. The DA conversion circuitry in accordance with claim 1, wherein said selector connects said first input port to said DA converter when the mode signal does not designate the test mode.

6. The DA conversion circuitry in accordance with claim 1, wherein, when the mode signal represents the test mode, the test data consecutively changing in one direction is received by said second input port, whereby said comparing circuit is allowed to output the resultant signal at a predetermined state indicating that said DA converter functions in order.

7. Digital-to-analog (DA) conversion circuitry comprising:

first and second DA converters each for converting digital data to an analog voltage substantially corresponding to the digital data;

two first input ports each for receiving input data to be converted in a digital form;

two second input ports each for receiving test data in a digital form;

a first selector operative in response to a mode signal for selectively connecting either one of said first input ports and one of said second input ports to said first DA converter, said first selector connecting said one second input port to said first DA converter when the mode signal designates a test mode;

a second selector operative in response to the mode signal for selectively connecting either the other of said first input ports and the other of said second input ports to said second DA converter, said second selector connecting said other second input port to said second DA converter when the mode signal designates the test mode; and a differential amplifier circuit interconnected to said first and second DA converters for outputting a voltage substantially equal to a difference between the analog voltages output from said first and second DA converters.

8. The DA conversion circuitry in accordance with claim 7, wherein, when the mode signal represents the test mode, first test data consecutively changing in one direction is received by said one second input port and second test data consecutively changing in the one direction with a predetermined difference kept from the first test data is received by said other second input port, whereby said differential amplifier circuit is allowed to output the voltage at a predetermined state indicating that said first and second DA converters function in order.

9. Digital-to-analog (DA) conversion circuitry comprising:

first and second DA converters each for converting digital data to an analog voltage substantially corresponding to the digital data;

two first input ports each for receiving input data to be converted in a digital form;

two second input ports each for receiving test data in a digital form;

a first selector operative in response to a mode signal for selectively connecting either one of said first input ports and one of said second input ports to said first DA converter, said first selector connecting said one second input port to said first DA converter when the mode signal designates a test mode;

a second selector operative in response to the mode signal for selectively connecting either the other of said first input ports and the other of said second input ports to said second DA converter, said second selector connecting said other second input port to said second DA converter when the mode signal designates the test mode;

a differential amplifier circuit interconnected to said first and second DA converters for outputting a voltage substantially equal to a difference between the analog voltages output from said first and second DA converters;

a voltage holding circuit interconnected to said differential amplifier circuit for holding the voltage output from said differential amplifier circuit in response to a sampling signal to output the voltage held as a hold voltage; and a comparator interconnected to said differential amplifier and said voltage holding circuit for comparing the voltage output from said differential amplifier with the hold voltage to output a signal representative of a result of comparison.

10. The DA conversion circuitry in accordance with claim 9, wherein, when the mode signal represents the test mode, first test data consecutively changing in one direction is received by said one second input port and second test data having a predetermined value is received by said other second input port, whereby said comparator is allowed to output the signal at a predetermined state indicating that said first DA converter functions in order.

* * * * *